United States Patent [19]

Carley

[11] 3,860,847

[45] Jan. 14, 1975

[54] HERMETICALLY SEALED SOLID STATE LAMP

[75] Inventor: James A. Carley, Rolling Hills, Calif.

[73] Assignee: Los Angeles Miniature Products, Inc., Torrance, Calif.

[22] Filed: Apr. 17, 1973

[21] Appl. No.: 352,006

[52] U.S. Cl. ......... 313/110, 313/108 D, 317/234 G, 250/211 J

[51] Int. Cl. ......... H01k 1/30

[58] Field of Search ......... 313/111, 110, 108 D; 317/234 G, 234 H; 250/211 J

[56] References Cited

UNITED STATES PATENTS

| | | | |
|---|---|---|---|
| 3,354,316 | 11/1967 | Deverall | 313/110 X |
| 3,400,311 | 9/1968 | Dahlberg et al. | 317/234 H |
| 3,404,319 | 10/1968 | Tsujo et al. | 313/111 X |
| 3,419,762 | 12/1968 | Lucas | 317/234 G |
| 3,510,732 | 5/1970 | Amans | 313/110 X |
| 3,528,169 | 9/1970 | Perrin et al. | 317/234 G |
| 3,676,668 | 7/1972 | Collins et al. | 313/111 X |
| 3,696,263 | 10/1972 | Wacher | 313/108 D |
| 3,739,241 | 6/1973 | Thillays | 317/234 H |

*Primary Examiner*—Alfred L. Brody
*Attorney, Agent, or Firm*—William C. Babcock

[57] ABSTRACT

An electro-luminiscent solid state lamp that may selectively include either a visible light or infra-red light emitting diodes in combination with a hermetically sealed assembly for maintaining the selected diode in isolation from contact with the ambient atmosphere, with the assembly concurrently acting as a heat sink to permit the diode to operate on an electric current of greater magnitude for a prolonged period of time than would otherwise be possible, and as a protector to prevent the diode from being physically damaged by inadvertent forceful contact with a hard object.

3 Claims, 7 Drawing Figures

PATENTED JAN 14 1975

3,860,847

HERMETICALLY SEALED SOLID STATE LAMP

BACKGROUND OF THE INVENTION

1. Field of the Invention

Hermetically sealed solid state lamp structure.

2. Description of the Prior Art

In the past, both visible light and infra-red light emitting diodes have been used for the production of a desired form of radiant energy by encapsulating the diodes in solid bodies of a polymerized resin, such as an epoxy resin or the like, that has suitable electric leads extending therethrough. A prior art lamp structure as above described has certain undesirable operational disadvantages, such as the epoxy plastic having an upper usable temperature level of approximately 100°C. Furthermore, the encapsulating material normally has poor heat transfer properties, and a limit is imposed on the magnitude of the electric current that may be used to energize the diodes without the latter heating to an excessive and damaging temperature.

In the past, light emitting diodes have also been assembled in packaging designed for other opto-electronic devices such as the modified TO-5 transistor package with glass lens. This type of structure has definite cost disadvantages imposed by the relatively large areas requiring glass-to-metal seals.

SUMMARY OF THE INVENTION

An electro-luminiscent solid state lamp in which radiant energy is produced by either a visible or infra-red light emitting diode that includes a p region and an n region that have a junction therebetween. An envelope is provided that has a side wall in the form of a surface of revolution, and includes first and second closed ends. The side wall and first and second ends cooperate to define a confined space filled with an inert gas that has good heat transfer properties, or in vacuum.

First and second laterally spaced, elongate electrical conducting members have intermediate portions thereof, hermetically sealed in the second end, with first portions of the members disposed inside the confined space, and second portions of the member exteriorly positioned from the second end. The second portions are capable of being connected to a source of electric power.

The diode is rigidly supported in the upper extremity of the first portion of the first member and with the p region of the diode in electrical communication with the first member. A thin resilient electrical conducting wire is attached at one end to the first portion of the second member and the second end attached to the n region of the diode, and with the wire situated in the confined space.

When electric current is supplied to the second portion of the first and second members in a forwardly biased direction, the diode is actuated to emit radiant energy which may be either visual light or infra-red light. The first end of the invention may be either frosted, clear or colored glass in the shape of a dome, flat end, or lens.

The second end of the envelope may be bead, butt, pinch, wedge, tip or stem sealed as is conventional in the lamp making art.

The primary object in devising the present invention is to supply a solid state lamp in which the light emitting diode is protected from contact with the ambient atmosphere by an assembly that concurrently acts as a heat sink and as a protector against the diode being damaged from inadvertent contact with a hard object.

Another object of the invention is to supply a solid state lamp that is capable of being manufactured by known lamp making techniques utilizing inexpensive materials and with the manufacturing carried out by highly automated equipment.

DESCRIPTION OF THE PREFERRED EMBODIMENT

Figures 1, 2:
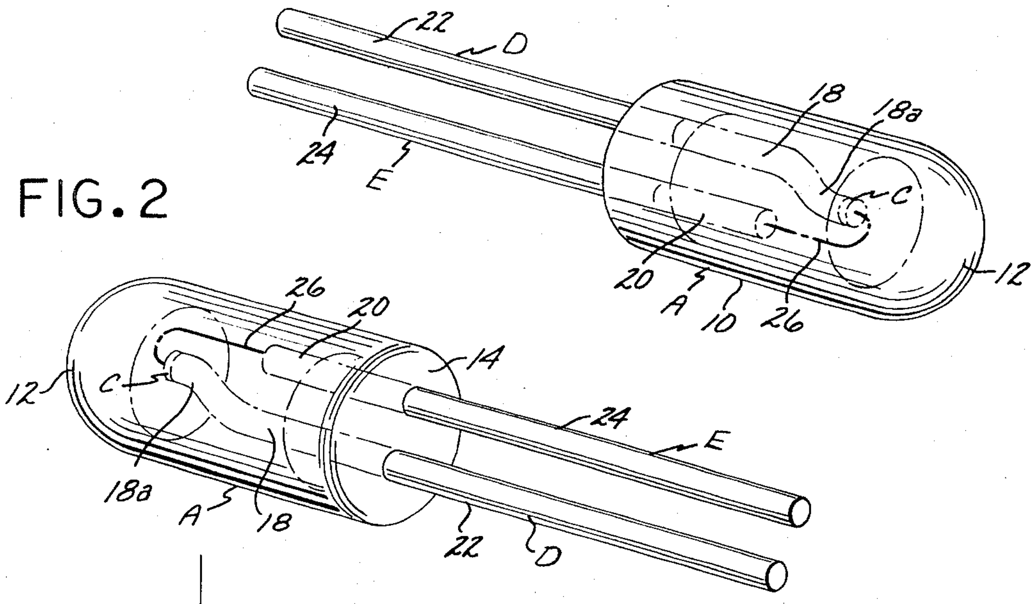
FIG. 1 is a first perspective view of the electro-luminiscent solid state lamp.
FIG. 2 is a second perspective view of the device shown in FIG. 1.
Figure 3:
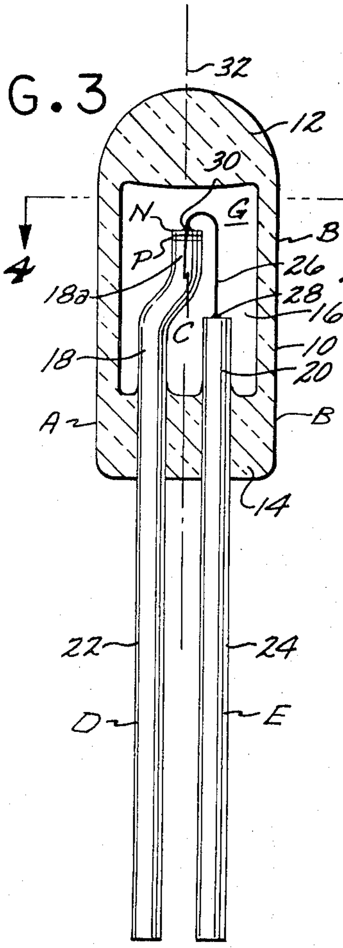
FIG. 3 is a longitudinal cross sectional view of the device shown in FIG. 2.

The solid state lamp A as may be seen in FIG. 3 includes an envelope B that has a sidewall 10 that is preferably in the shape of a surface of revolution, and is illustrated as being a cylinder. The sidewall 10 has first and second closed ends 12 and 14, with the first end being illustrated in FIG. 3 as being a lens. Sidewall 10 and first and second ends 12 and 14 cooperate to define a confined space 16 that is preferably filled with an inert gas, such as helium, that has good heat transfer capability.

The envelope B is illustrated in Figure as having the side wall 10 and first and second ends 12 and 14 formed integrally and from glass. However, the side wall 10, and first and second ends 12 and 14 may be separate elements that are hermetically sealed together to define the confined space 16. The first end 12 must be formed from a material such as glass or plastic that transmits the radiant energy emitted by the diode C therethrough. The side wall 10 may be opaque if desired and formed from metal. The structure of the envelope B will of course depend on the purpose for which the lamp A is to be used.

First and second laterally spaced, elongate, electrical conducting members D and E are provided that have intermediate portions thereof hermetically formed in the second end 14. First portions 18 and 20 of the members D and E project into the confined space 16, and second portions 22 and 24 of the first and second members extend outwardly from the second end 14 and are capable of being connected to a source of electrical power (not shown).

The first and second members D and E are preferably spaced inwardly equal distances from the outer periphery of the second end 14. As may be seen in FIG. 3, the first portion 20 of the second member D is substantially shorter than the first portion of first member D. The first portion 18 of first member C on the upper extremity thereof supports a conventional light emitting diode C that has an n region and a p region that are separated by a junction as is conventional with such devices, and the p region being bonded to the upper extremity of the first portion 18 of the first member C as shown in FIG. 3 and in electrical communication therewith.

The upper extremity of the first portion 20 of second member E has a fine resilient wire 26 electrically bonded thereto by an electrically conducting bead 28 with the wire extending upwardly and having the upward end thereof bonded to the n region of the diode C by an electrically conducting bead 30. The first portion 18 of the first member D is offset to have the upper part 18a thereof coaxially aligned with the longitudinal center line 32 of the envelope B. When electrical current (not shown) is caused to flow through the members D and E in a forwardly biased direction, the light emitting diode C is electrically energized. When it is desired to produce infra-red light from the diode C, it has been found convenient to use a diode C of the gallium arsenide type. When it is desired to have the diode C luminesce to provide visual light it has been found convenient to use a diode of the gallium arsenide phosphide type. It will be apparent that the first end 12 must be and is preferably formed from glass or other transparent material that has good light transmitting qualities for the form of radiant energy generated by the diode C when the latter is electrically energized.

Figure 5:
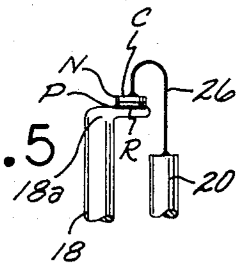
FIG. 5 is a fragmentary side elevational view of an alternate form of the invention that disposes the light emitting diode on the longitudinal axis of the envelope B.
Figure 7:
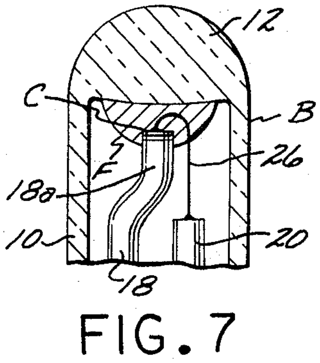

Alternatives to the structure described above are as follows:

a. When desirable, a built-in resistor R may be included in this structure by bonding a thick film, thin film, or semi-conductor chip resistor, including nonlinear type resistors to either of two convenient locations within the flow path of the electrical current. If convenient, the resistor may be bonded between portion 18*a* of first member C, and a region *p* of the light emitting diode. If suitable bonding pads are an integral part of its construction, the resistor R may be bonded to portion 20 of second member D in a manner similar to the method used to bond the light emitting diode to the first member C.

b. An alternative to the off-set of member C to have the upper part 18*a* coaxially aligned with the longitudinal center of the envelope is a right angle bend and flattening of upper portion 18*a* as shown in FIG. 5. The light-emitting diode C could then be positioned on the longitudinal center in such a manner as to transmit radiant energy through first end 12.

c. When desired, a reflecting surface R may be included in the structure between the light-emitting diode C and the second end 14, with this surface being a part of portion 18*a*. The purpose of this reflector would be to increase radiant energy output through first end 12, especially in the case where the light-emitting diode is of the gallium phosphide type.

d. The n region of the diode C may be bonded to the lens at first end 12 (FIG. 7), using a clear conformal body of resin F of good light-transmitting qualities. The purpose of body F is to reduce reflective light losses by providing a light path through materials with relatively constant index of refraction until leaving first end 12.

Figure 4:
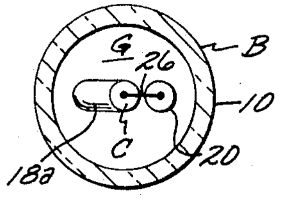
FIG. 4 is a transverse cross sectional view of the device shown in FIG. 3 taken on the line 4—4 thereof.
Figure 6:
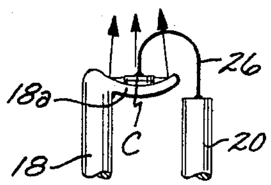
FIG. 6 is a fragmentary side elevational view of an alternate form of the invention in which the offset portion that supports the light emitting diode is light reflecting and reflects light emitted from the diode through an end portion of the envelope and FIG. 7 is a fragmentary longitudinal cross sectional view of an alternate form of the invention in which the light emitting diode is bonded by a light transmitting resin to an end portion of the envelope.

The diode C as may be seen in FIGS. 3 and 4 is centered in the confined space 16, and with the inert gas G that serves as a heat sink, transmitting heat from all portions of the diode at an equal rate to the side wall 10 where the heat is radiated to the ambient atmosphere. Due to the rate of heat transfer from all portions of the diode C being substantially uniform, the diode is subjected to a minimum of thermal stress when electrically energized. The wire 26 is of relatively small diameter and flexible and places no physical strain on the diode C in the event the diode expands or contracts longitudinally when electrically energized.

Due to the gas G in the confined space 16 acting as a heat sink, heat is rapidly dissipated from the diode C, and the diode may accordingly be operated by an electric current of greater magnitude than would be possible were the heat generated by energization of the diode not quickly and uniformly transferred therefrom.

Although the first end 12 has been illustrated in FIG. 3 as being in the form of a lens, the first end may be a continuation of the side wall 10 and may be clear, frosted, or colored. The second end 14 may be a bead as shown in FIG. 3 or may be a butt, pinch, wedge, or stem sealed structure. The second portions 22 and 24 of the members C and D may be either stiff for a plug in type of connection, or flexible leads as desired. The electro-luminiscent solid state lamp A, previously described, has numerous applications and is particularly adapted for such uses as on circuit board panels on either stationary or mobile equipment, and is particularly adapted to those applications that are subjected to substantial vibration, due to the minimum detrimental effect such vibration has on a solid state lamp of the structure above described.

When the diode C is of the type that emits infrared light when electrically energized, the solid state lamp C above described is particularly useful in high volume application as paper tape and punch card readers, optical memory systems, shaft encoders, photo choppers and the like.

The structure and use of the solid state lamp A has been described previously in detail and need not be repeated.

I claim:

1. A solid state lamp of the type that includes a light emitting diode having a *p* region and an *n* region and said lamp being characterized by an assembly that concurrently acts as a heat sink and protector for said diode, said assembly comprising:

a. a rigid glass envelope having a side wall in the form of a surface of revolution and first and second ends, said first end capable of transmitting light therethrough;

b. first means for hermetically sealing said second end of said envelope, said first means and envelope cooperating to define a confined space within the interior of the latter;

c. an inert heat conducting gas situated in said confined space;

d. first and second laterally spaced elongate electrical conducting members that have intermediate portions thereof hermetically sealed in said first means, with said members having first portions thereof situated in said confined space, and said members having second portions thereof projecting outwardly from said first means and connectable to a source of electric power, with said first portion of said first member supporting said diode in a fixed position in said confined space in such a manner that said *p* region of said diode is in electrical communication with said first portion, and said diode aligned with the longitudinal axis of said envelope; and e. second means for maintaining electrical communication between said *n* region and first portion of said second conductor to cause said diode to luminesce when an electric current is applied to said second portions of said first and second members in a forwardly biased direction, said envelope preventing said diode being damaged by forceful contact with a hard object, and said gas due to said diode being centered in said envelope conducting heat from all parts of said diode at an equal rate during the operation of said lamp to minimize said diode being subjected to thermal strains.

2. A solid state lamp as defined in claim 1 in which said second portions of said first and second members are equally spaced from the outer periphery of said second end, and said first portion of said first member has an offset formed therein to position said diode in alignment with said longitudinal axis of said envelope.

3. A solid state lamp as defined in claim 1 in which said second means is a resilient electrical conductive wire that extends between said *n* region and said diode and said first portion of said second member and is rigidly bonded thereto.

* * * * *